United States Patent
Chiang et al.

(10) Patent No.: US 8,080,454 B2
(45) Date of Patent: Dec. 20, 2011

(54) METHOD OF FABRICATING CMOS TRANSISTOR

(75) Inventors: Wen-Tai Chiang, Tainan County (TW); Chen-Hua Tsai, Hsinchu County (TW); Cheng-Tzung Tsai, Taipei (TW); Po-Wei Liu, Taichung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/605,377

(22) Filed: Oct. 26, 2009

(65) Prior Publication Data
US 2011/0097859 A1      Apr. 28, 2011

(51) Int. Cl.
*H01L 21/8238* (2006.01)
(52) U.S. Cl. . 438/199; 438/528; 438/530; 257/E21.335; 257/E21.619; 257/E21.632
(58) Field of Classification Search .......... 438/199, 438/528, 530; 257/E21.057, E21.335, E21.619, 257/E21.632
See application file for complete search history.

(56) References Cited

U.S. PATENT DOCUMENTS

| | | | |
|---|---|---|---|
| 7,052,946 B2 | 5/2006 | Chen | |
| 7,135,365 B2 | 11/2006 | Liu | |
| 7,354,836 B2 * | 4/2008 | Hoentschel et al. | 438/301 |
| 7,402,496 B2 * | 7/2008 | Liu et al. | 438/300 |
| 7,485,515 B2 | 2/2009 | Chen | |
| 2005/0136583 A1 | 6/2005 | Chen | |
| 2007/0010073 A1 | 1/2007 | Chen | |
| 2007/0048907 A1 * | 3/2007 | Lee et al. | 438/142 |
| 2007/0141775 A1 | 6/2007 | Teo | |
| 2009/0256160 A1 | 10/2009 | Liu | |

OTHER PUBLICATIONS

Qiuxia Xu et al., "A New Low-cost Technique for Mobility Enhancement of PMOSFETs Strained by Ge Pre-amorphization Implantation for Source/Drain Extension", Dec. 2005, p. 404-405, IEEE.
John Borland, "Chipmakers, consortia reveal HK+MG integration", Exclusive Feature #2 VLSI Symposium Report, Aug. 2007, p. 1-7, Solid State Technology.
Yaocheng Liu et al., "Strained Si Channel MOSFETs with Embedded Silicon Carbon Formed by Solid Phase Epitaxy", Jun. 2007, p. 44-45, 2007 Symposium on VLSI Technology Digest of Technical Papers.
A. Wei et al., "Multiple Stress Memorization in Advanced SOI CMOS Technologies", Jun. 2007, p. 216-217, 2007 Symposium on VLSI Technology Digest of Technical Papers.
Masayuki Tanaka et al.,"Suppression of SiN-Induced Boron Penetration by Using SiH-Free Silicon Nitride Films Formed By Tetrachlorosilane and Ammonia", Sep. 2002, p. 1526-1531, vol. 49, No. 9, IEEE Transactions on Electron Devices.
K. Ota et al., "Novel locally strained channel technique for high performance 55nm CMOS", 2002, p. 27-30, IEEE.
H. Fukutome et al., "Suppression of Poly-Gate-Induced Fluctuations in Carrier Profiles of Sub-50nm MOSFETs", Dec. 2006, p. 1-4.

(Continued)

*Primary Examiner* — Mary Wilczewski
*Assistant Examiner* — Toniae Thomas
(74) *Attorney, Agent, or Firm* — Winston Hsu; Scott Margo

(57) ABSTRACT

A method of fabricating a CMOS transistor includes forming strained channels by re-crystallized amorphous polysilicon with the tensile film or the compressive film during annealing. C or Ge ions are optionally used to form solid-phase epitaxy to amplify the stress in the strained channel. Therefore, the charge carrier mobility in a CMOS transistor is improved.

18 Claims, 6 Drawing Sheets

OTHER PUBLICATIONS

Bin Yu et al., "Gate Engineering for Deep-Submicron CMOS Transistors", Jun. 1998, p. 1253-1262, vol. 45, No. 6, IEEE Transactions on Electron Devices.

Yung Fu Chong et al., "Laser Thermal Processing of Amorphous Silicon Gates to Reduce Poly-Depletion in CMOS Devices", May 2004, pp. 669-676, vol. 51, No. 5, IEEE Transactions on Electron Devices.

A. Shimizu et al., "Local Mechanical-Stress Control (LMC) : A New Technique for CMOS-Performance Enhancement", 2001, p. 19.4.1-19.4.4, IEEE.

Chien-Hao Chen et al., "Stress Memorization Technique (SMT) by Selectively Strained-Nitride Capping for Sub-65nm High-Performance Strained-Si Device Application", 2004, pp. 56-57, 2004 Symposium on VLSI Technology Digest of Technical Papers, IEEE.

Hidenobu Fukutome et al., "Continuous Scaling Methodology of Planar CMOS Transistors by Suppressing Fluctuation in Carrier Profile", Jun. 2007, pp. 206-207, 2007 Symposium on VLSI Technology Digest of Technical Papers.

\* cited by examiner

METHOD OF FABRICATING CMOS TRANSISTOR

BACKGROUND OF THE INVENTION

1. Field of the Invention

The present invention is related to a method of forming a CMOS transistor.

2. Description of the Prior Art

In general, a MOS transistor includes a substrate such as a silicon substrate, a source region, a drain region, a channel region positioned between the source region and the drain region, a gate positioned on the channel, a gate dielectric layer positioned between the gate and the substrate and a spacer positioned on the sidewall of the gate and the gate dielectric layer. When a MOS transistor is under a fixed electric field, the current passing through the channel region is proportional to the carrier mobility. Therefore, it would be desirable to implement the carrier mobility to optimize the performance of the MOS transistor.

One conventional approach for enhancing the carrier mobility is to form mechanical stresses within the channel region. For example, a compressive strained channel can be formed by epitaxially growing a SiGe (silicon germanium) layer on the substrate. In this way, the hole mobility is enhanced greatly. In another example, a tensilely stressed channel can be formed by epitaxially growing silicon directly over a SiGe layer. In this way, the electron mobility is enhanced.

The above-mentioned approaches are performed by utilizing the fact that silicon and germanium have a different lattice constant. In this way, band structure of the silicon is deformed because the lattice constant of germanium is greater than silicon. The carrier mobility is thereby increased and the performance of the MOS transistor is improved.

As the integrity of semiconductor devices increases, however, the size of the CMOS is decreasing. The demand for high speed CMOS is increasing as well. The conventional method of forming mechanical stresses within the channel region is no longer sufficient.

SUMMARY OF THE INVENTION

For the above reasons, a method of fabricating CMOS transistors and thereby improving their performance has been developed.

The present invention provides a method of forming a CMOS transistor. The method comprises the steps of: providing a substrate comprising a first transistor region, a second transistor region, and an insulator positioned between the first transistor region and the second transistor region, wherein the first transistor region is used for forming a first-type conductivity transistor and the first transistor region comprises a first gate and a first source/drain region, the second transistor region is used for forming a second-type conductivity transistor and the second transistor region comprises a second gate and a second source/drain region; performing a first amorphizing process in the first source/drain region; forming a first stressor covering the first gate and the first source/drain region; performing a first annealing process to form a first strained silicon channel in the substrate under the first gate; removing the first stressor; performing a second amorphizing process in the second source/drain region; forming a second stressor covering the second gate and the second source/drain region; performing a second annealing process to form a second strained silicon channel in the substrate under the second gate; and removing the second stressor.

According to the claimed invention, another method of forming a CMOS transistor comprises steps of: providing a substrate comprising a first transistor region, a second transistor region, and an insulator positioned between the first transistor region and the second transistor region, wherein the first transistor region is used for forming a first-type conductivity transistor and the first transistor region comprises a first gate and a first source/drain region, the second transistor region is used for forming a second-type conductivity transistor and the second transistor region comprises a second gate and a second source/drain region; performing an amorphizing process in the first source/drain region and in the second source/drain region; forming a first stressor covering the first gate and the first source/drain region; forming a second stressor covering the second gate and the second source/drain region; performing an annealing process to form a first strained silicon channel in the substrate under the first gate and form a second strained silicon channel in the substrate under the second gate; and removing the first stressor and the second stressor.

The CMOS transistor with strained channel of the present invention is achieved by forming an amorphous structure in the source/drain regions of the N-type transistor and the P-type transistor respectively. The tensile stressor and the compressive stressor are disposed on the N-type transistor and the P-type transistor respectively. After an annealing process, the stress memorization technique (SMT) in the source/drain region is completed. The solid-phase epitaxy (SPE) technique can be combined with the SMT mentioned above. By forming the SiC and SiGe in the source/drain region of the N-type transistor and the P-type transistor respectively, the carrier mobility of the CMOS transistor can be greatly enhanced by both SMT and SPE.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
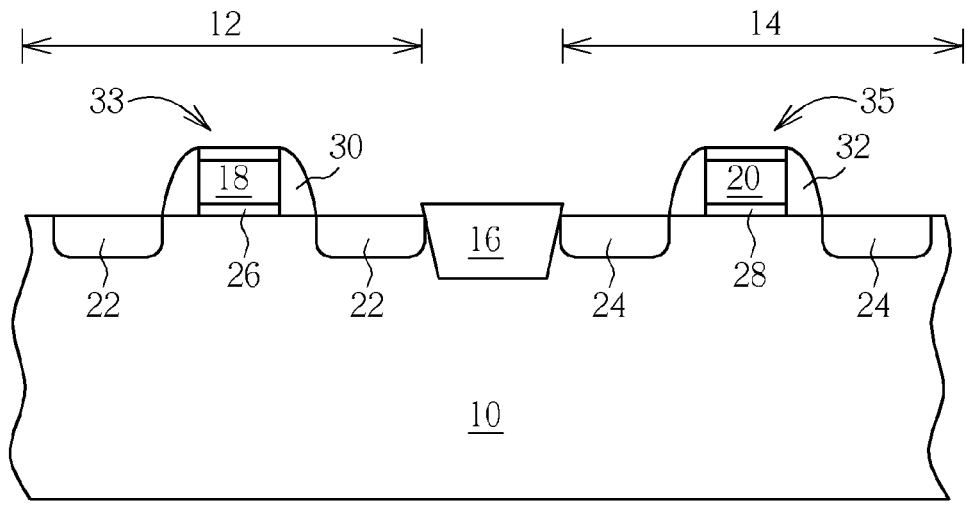
FIG. 1 to FIG. 6 are schematic diagrams illustrating a method of forming a CMOS transistor according to a first preferred embodiment of the present invention.

FIG. 1 to FIG. 6 are schematic diagrams illustrating a method of forming a CMOS transistor according to a first preferred embodiment of the present invention. As shown in FIG. 1, a substrate 10 such as a silicon substrate or a SOI is provided. The substrate 10 includes a first transistor region 12 and a second transistor region 14. The first transistor region 12 and the second transistor region 14 are isolated by an insulator such as a STI 16. The first transistor region 12 is an active area used for forming a first-type conductivity transistor. That is, the transistor positioned in the first transistor region 12 has the first-type conductivity such as N type. The second transistor region 14 is an active area used for forming a second-type conductivity transistor. That is, the transistor positioned in the second transistor region 14 has the second-type conductivity such as P type.

In addition, the first transistor region 12 includes a first gate 18 and a source/drain region 22 and the second transistor region 14 includes a second gate 20 and a source/drain region 24. A gate dielectric layer 26 is positioned between the first gate 18 and the substrate 10 and a gate dielectric layer 28 is positioned between the second gate 20 and the substrate 10. Spacers 30, 32 are positioned at the sidewall of the first gate 18 and the second gate 20. In general, the first gate 18 and the second gate 20 can be made by doped polysilicon, salicide or another conductor. The gate dielectric layers 26, 28 can be made from silicon oxide, silicon nitride, high K dielectric materials, or other insulators. The spacers 30, 32 can be made of silicon oxide or silicon nitride. It is noteworthy that spacers can be a single structure as shown in FIG. 1, or be a dual structure including an offset spacer and a main spacer (not shown), or a triple structure (not shown).

Next, an amorphizing process is performed. The first gate 18 and the second gate 20 are taken as a mask to form an amorphous structure in the source/drain regions 22, 24 simultaneously. It is noteworthy that the amorphizing process can be a blanket ion implantation process. For example, the blanket ion implantation process can be performed by implanting the xenon (Xe) ions or the argon (Ar) ions into the source/drain regions 22, 24 simultaneously. According to a preferred embodiment of the present invention, after amorphizing the source/drain regions 22, 24, dopants can be implanted into the source/drain regions 22, 24 to be conductors. For example, when the first-type conductivity is N type and the second-type conductivity is P type, the dopants implanted into the source/drain region 22 are N type and the dopants implanted into the source/drain region 24 are P type. The first gate 18 positioned in the first transistor region 12, the source/drain region 22, the gate dielectric layer 26 and the spacer 30 form a first-type conductivity transistor 33; in the same way, the second gate 20 positioned in the second transistor region 14, the source/drain region 24, the gate dielectric layer 28 and the spacer 32 form a second-type conductivity transistor 35. However, the present invention is not limited to implanting dopants acting as conductors into the source/drain regions 22, 24 at the point mentioned above. Based on different requirement, the dopants can be implanted in the process later or can be implanted before the amorphizing process is performed, which is also within the scope of the present invention.

Figure 2:
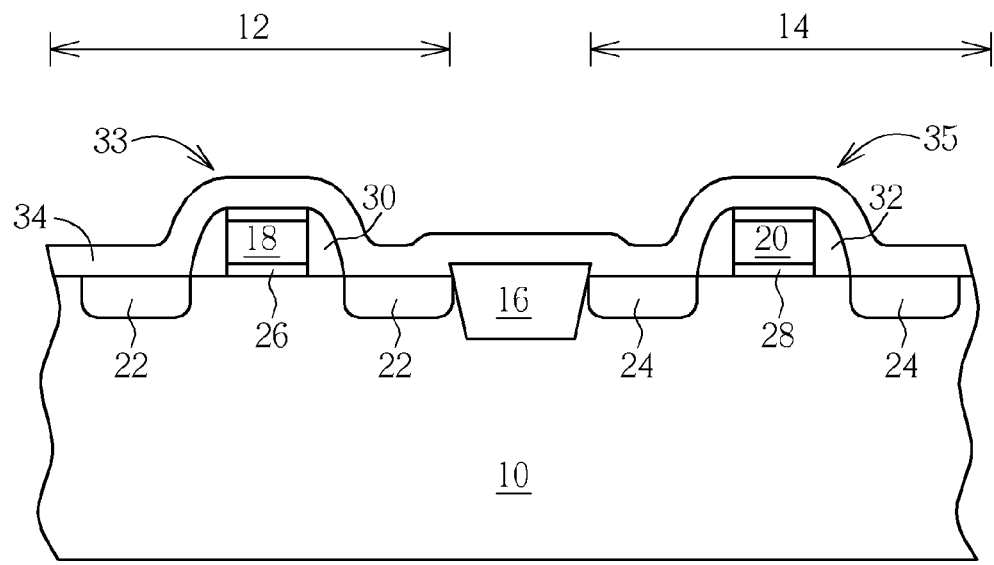
Figure 3:
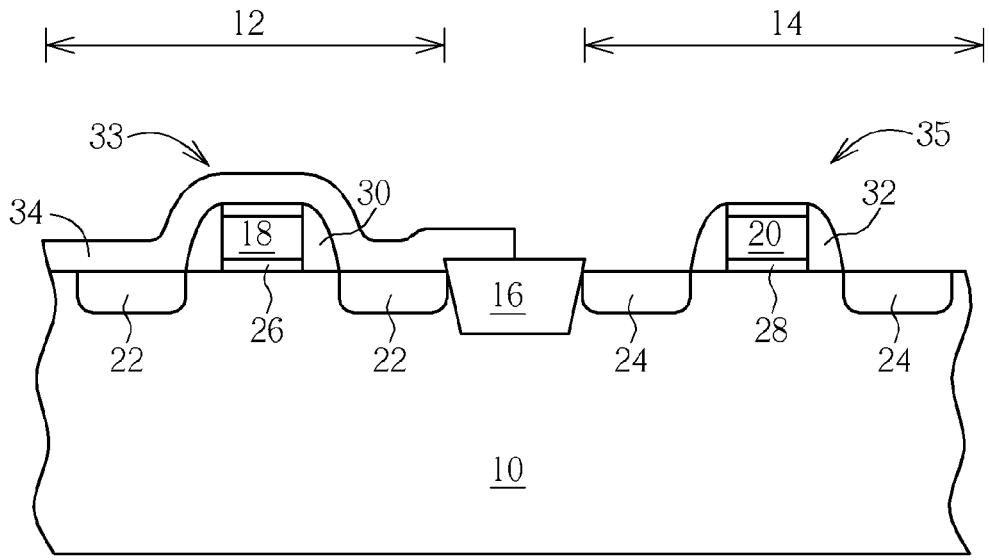

As shown in FIG. 2, a deposition process is performed to form a first stressor 34 covering the first gate 18, the source/drain region 22, the STI 16, the second gate 20 and the source/drain region 24. Next, as shown in FIG. 3, the first stressor positioned on the second gate 20, the source/drain region 24 and part of the STI 16 is removed by lithography and etching process.

Figure 4:
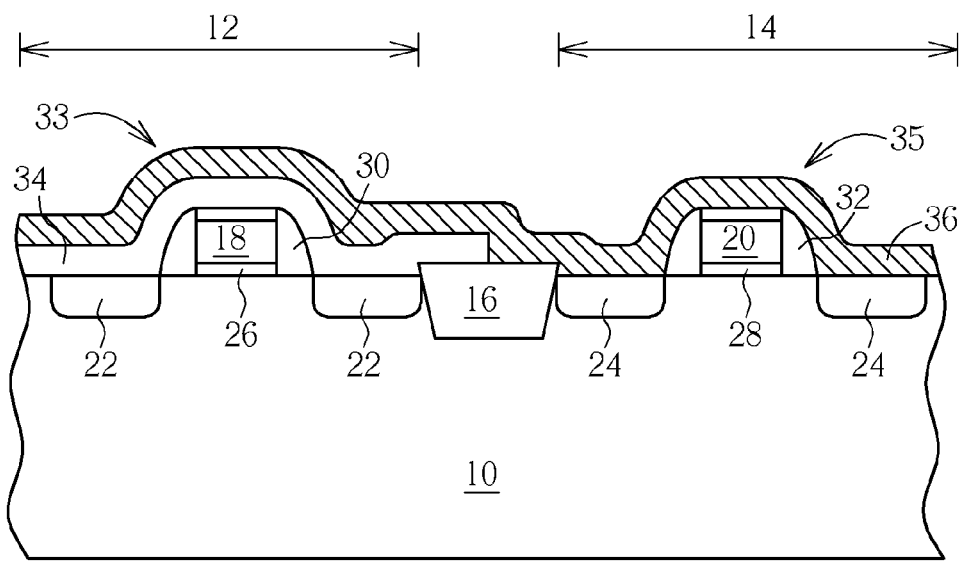
Figure 5:
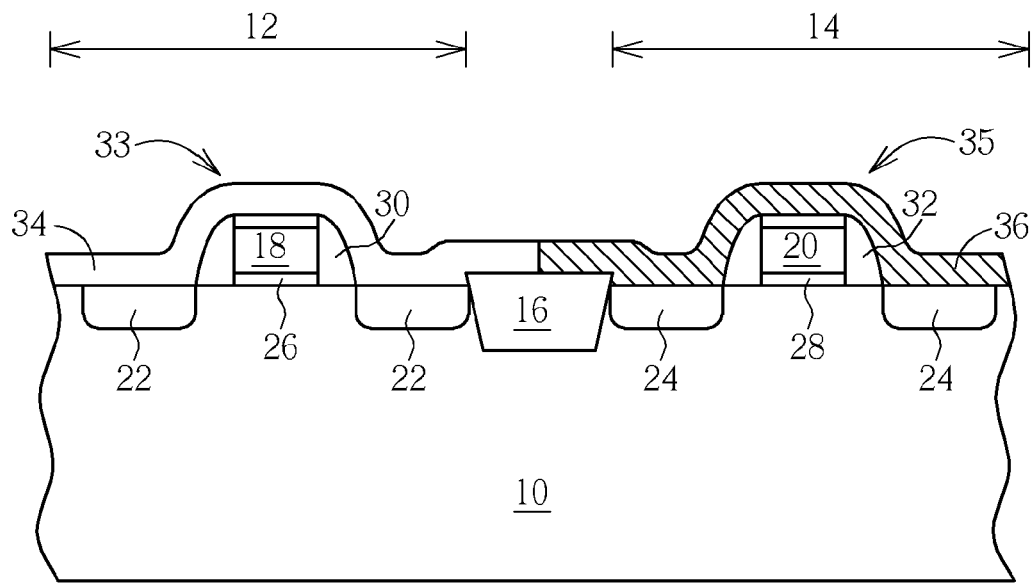

As shown in FIG. 4, another deposition process is performed to form a second stressor 36. The second stressor 36 covers the first stressor 34 covering the first gate 18, the source/drain 22, and the second gate 20, the source/drain region 24 and part of the STI 16. As shown in FIG. 5, the second stressor 36 covering the first stressor 34 positioned on the first gate 18 and the source/drain region 22 is removed. It is noteworthy that when the first-type conductivity is N type and the second-type conductivity is P type, the first stressor 34 is a tensile film and the second stressor 36 is a compressive film.

Figure 6:
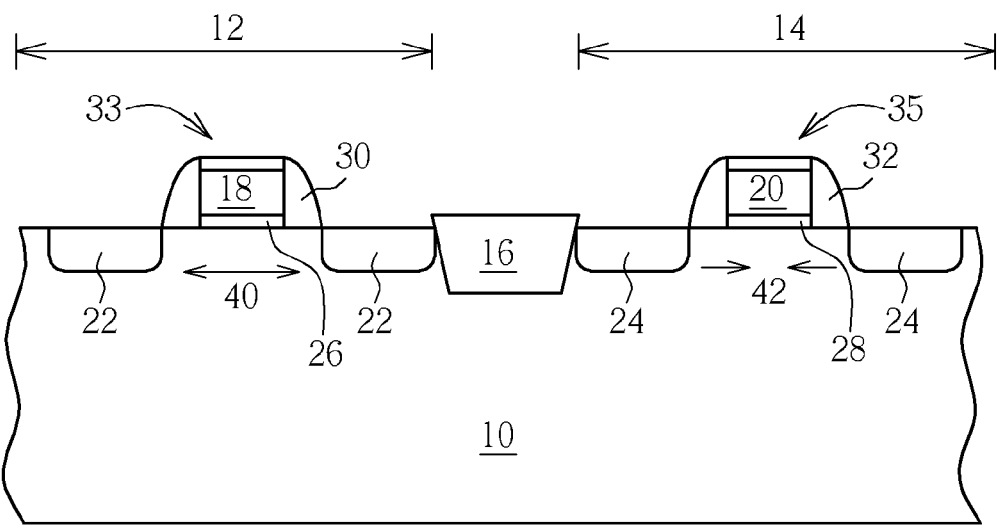

As shown in FIG. 6, an annealing process is performed. According to the preferred embodiment, the annealing process is a low temperature annealing process which is performed between 580° C. to 850° C. The silicon atoms in the amorphous structure in the source/drain regions 22, 24 will be re-crystallized according to the tensile/compressive directions that the first stressor 34 and the second stressor 36 provided. Then a first strained silicon channel 40 is formed in the substrate 10 under the first gate 18; a second strained silicon channel 42 is formed in the substrate 10 under the second gate 20. After that, the first stressor 34 and the second stressor 36 are removed. The stress memorization technique (SMT) applied in the source/drain region is completed by performing the annealing process only once. It is noteworthy that the when the first-type conductivity is N type and the second-type conductivity is P type, the strained silicon channel 40 is a tensile strain channel and the strained silicon channel 42 is a compressive strain channel.

According to the second preferred embodiment of the present invention, Xe ions or Ar ions used in the blanket ion implantation process mentioned in the first preferred embodiment can be replaced by carbon (C) ions and germanium (Ge) ions to amorphousize the transistors having the corresponding conductivity. For example, when the first-type conductivity is N type and the second-type conductivity is P type, the C ions are implanted into the source/drain region 22 and the Ge ions are implanted into the source/drain region 24. Other fabricating steps are the same as that in the first preferred embodiment. Compared to the first preferred embodiment, in the second preferred embodiment, the amorphous structure in the source/drain regions 22,24 is formed by implanting the C ions and Ge ions, and the silicon atoms are re-crystallized to form the corresponding tensile/compressive strained silicon channel. After that, the solid-phase epitaxy (SPE) is formed in the source/drain regions 22, 24 during the annealing process. For example, the embedded silicon carbon (eSiC) is formed in the source/drain region 22 and the embedded silicon germanium (eSiGe) is formed in the source/drain region 24. As one skilled in the art should know, the eSiGe and the eSiC can provide tensile/compressive stress in the substrate. There will then be an additive effect to the carrier mobility of the transistors due to the SPE and the SMT. In the same way, the dopants acting as conductors in the source/drain regions 22, 24 can be implanted before C ions and Ge ions are implanted, after the C ions and Ge ions are implanted or after the SPE is formed.

According to the third embodiment of the present invention, the blanket ion implantation process can be performed by amorphizing the source/drain regions 22, 24 by Xe ions or Ar ions firstly, then when the first-type conductivity is N type and the second-type conductivity is P type, C ions are implanted into the source/drain region 22 and Ge ions are implanted into the source/drain region 24 in order to provide the dopants for the SPE. Other fabricating steps are the same as that in the first preferred embodiment. Then, the SMT and SPE can be completed by preformed the annealing process only once. In the same way, the dopants acting as conductors in the source/drain regions 22, 24 can be implanted before the amorphizing process, after the amorphizing process but before C ions and Ge ions are implanted or after the SPE is formed.

FIG. 7 to FIG. 12 are schematic diagrams illustrating a method of forming a CMOS transistor according to a fourth preferred embodiment of the present invention. To simplify the illustration, elements with the same function will use the same numerals in FIG. 1 to FIG. 6.

Figure 7:
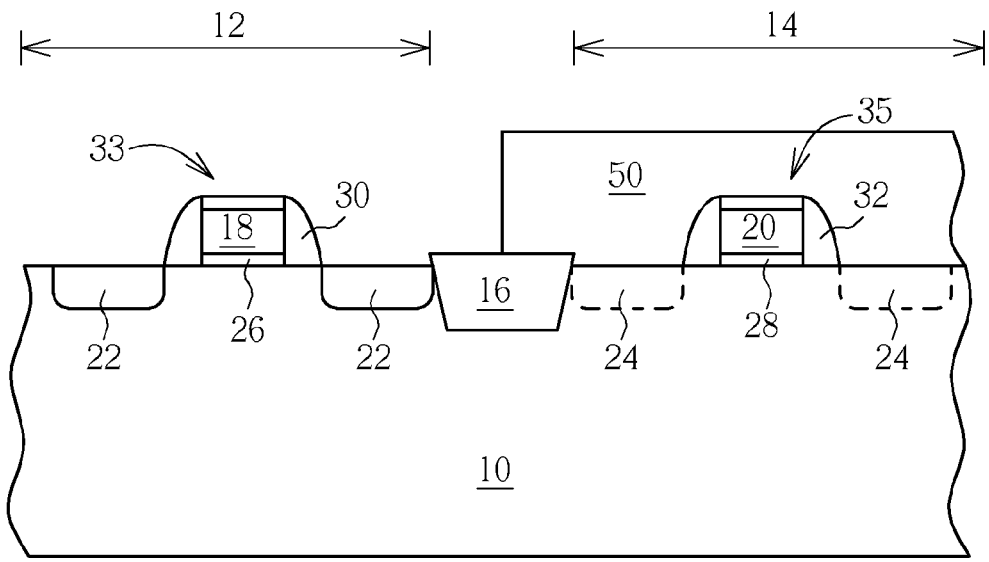
FIG. 7 to FIG. 12 are schematic diagrams illustrating a method of forming a CMOS transistor according to a fourth preferred embodiment of the present invention.

As shown in FIG. 7, a substrate 10 such as a silicon substrate or a SOI is provided. The substrate 10 includes a first transistor region 12 and a second transistor region 14. The first transistor region 12 and the second transistor region 14 are isolated by an insulator such as an STI 16. The first transistor region 12 is an active area used for forming a first-type conductivity transistor. That is, the transistor positioned in the first transistor region 12 has the first-type conductivity such as N type. The second transistor region 14 is an active area used for forming a second-type conductivity transistor. That is, the transistor positioned in the second transistor region 14 has the second-type conductivity such as P type.

In addition, the first transistor region 12 includes a first gate 18 and a source/drain region 22 and the second transistor region 14 includes a second gate 20 and a source/drain region 24. A gate dielectric layer 26 is positioned between the first gate 18 and the substrate 10 and a gate dielectric layer 28 is positioned between the second gate 20 and the substrate 10. Spacers 30, 32 are positioned at the sidewall of the first gate 18 and the second gate 20. In most cases, the first gate 18 and the second gate 20 can be made by doped polysilicon, salicide or other conductors. The gate dielectric layers 26, 28 can be made from silicon oxide, silicon nitride, high K dielectric materials, or other insulators. The spacers 30, 32 can be made of silicon oxide or silicon nitride. It is noteworthy that spacers can be the single structure shown in FIG. 1, or be a dual structure including an offset spacer and a main spacer (not shown), or a triple structure (not shown).

Next, a mask 50 such as a photoresist is formed on the second transistor region 14 and part of the STI 16 to expose the first transistor region 12. Then, an amorphizing process is performed, for example, by implanting Xe ions or Ar ions into the source/drain region 22 to form an amorphous structure in the source/drain region 22.

According to a preferred embodiment of the present invention, after amorphizing the source/drain region 22, dopants can be implanted into the source/drain region 22 to form the conductor. For example, when the first-type conductivity is N type the dopants implanted into the source/drain region 22 are N type. The first gate 18 positioned in the first transistor region 12, the source/drain region 22, the gate dielectric layer 26 and the spacer 30 form a first-type conductivity transistor 33. The mask 50 is then removed. However, the present invention is not limited to implanting dopants acting as conductors into the source/drain region 22 at the point mentioned above. Based on different requirements, the dopants can be implanted in the process later or can be implanted before the amorphizing process is preformed.

Figure 8:
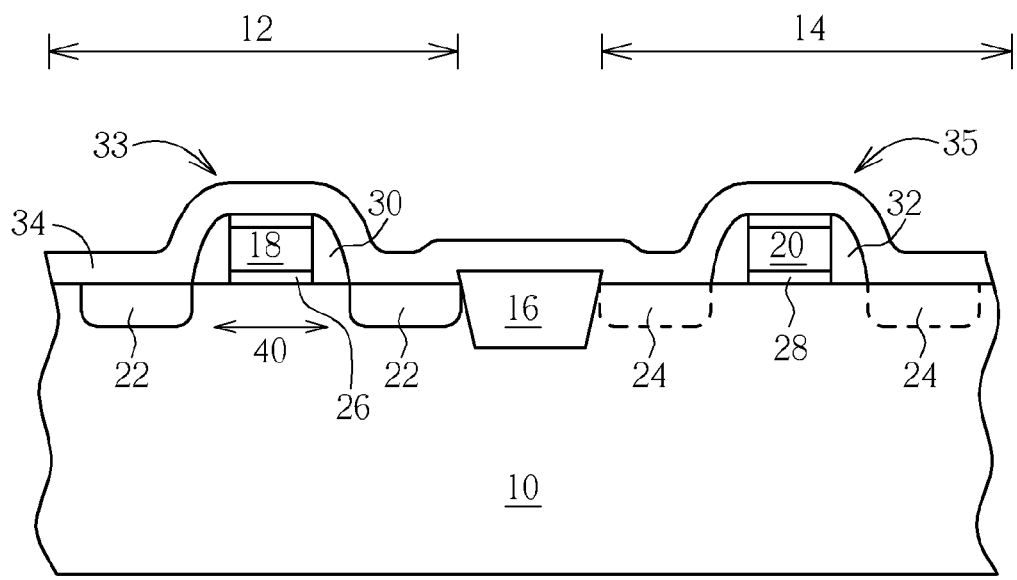
Figure 9:
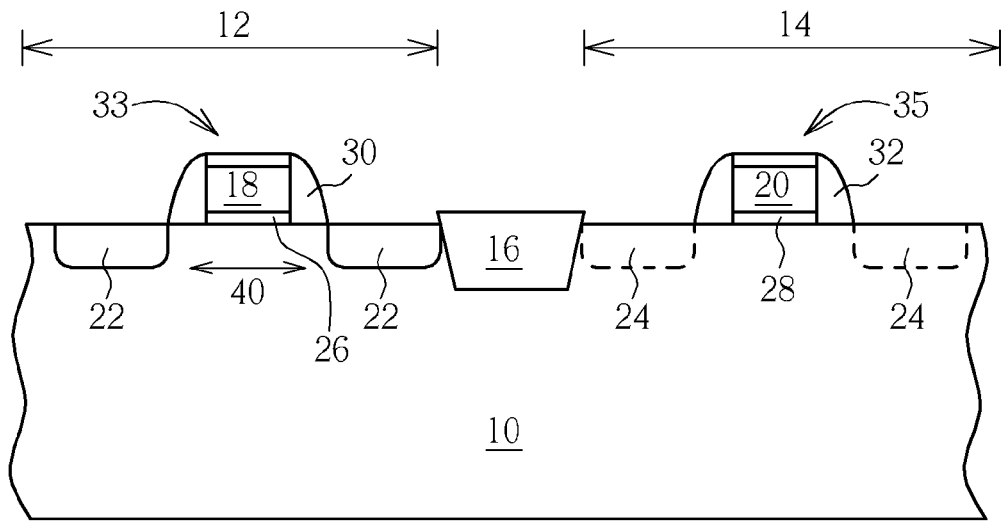

As shown in FIG. 8, a deposition process is performed to form a first stressor 34 covering the first gate 18, the source/drain region 22, the STI 16, the second gate 20 and the source/drain region 24. Then, a first annealing process is performed. According to the preferred embodiment, the annealing process is a low temperature annealing process which is performed between 580° C. and 850° C. The amorphous silicon will be re-crystallized according to the tensile directions that the first stressor 34 provided to form a first strained silicon channel 40. Then as shown in FIG. 9, the stressor 34 is removed.

Figure 10:
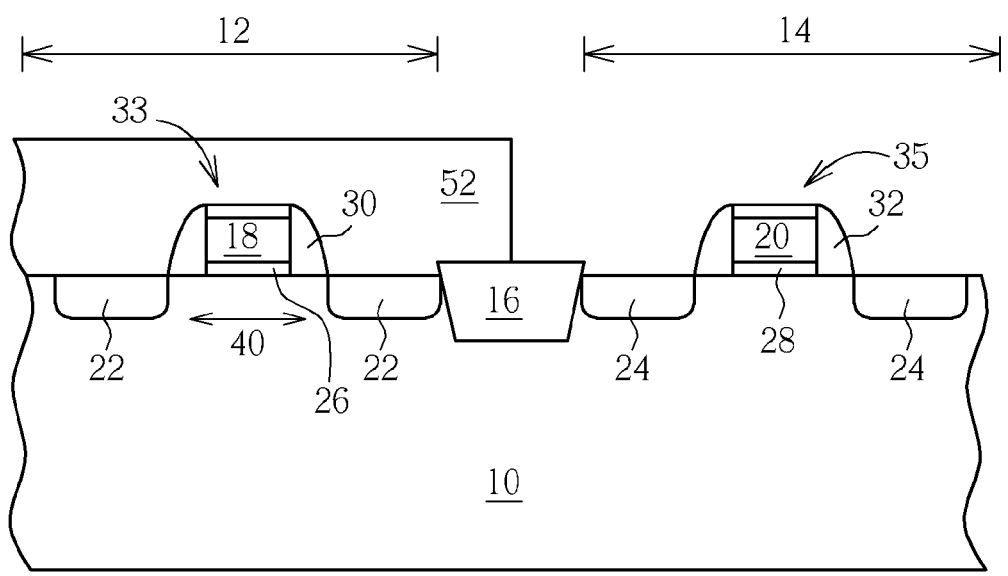

As shown in FIG. 10, a mask 52 such as a photoresist is formed on the first transistor region 12 and part of the STI 16 to expose the second transistor region 14. Then, an amorphizing process is performed, for example, by implanting Xe ions or Ar ions into the source/drain region 24 to form an amorphous structure in the source/drain region 24. According to a preferred embodiment of the present invention, after amorphizing the source/drain region 24, dopants can be implanted into the source/drain region 24 to be conductors. For example, when the second-type conductivity is P type the dopants implanted into the source/drain region 24 are P type. The second gate 20 positioned in the second transistor region 14, the source/drain region 24, the gate dielectric layer 28 and the spacer 32 form a second-type conductivity transistor 35. The mask 52 is then removed. However, the present invention is not limited to implanting dopants acting as conductors into the source/drain region 24 at the point mentioned above. Based on different requirements, the dopants can be implanted in the process later or can be implanted before the amorphizing process is performed.

Figure 11:
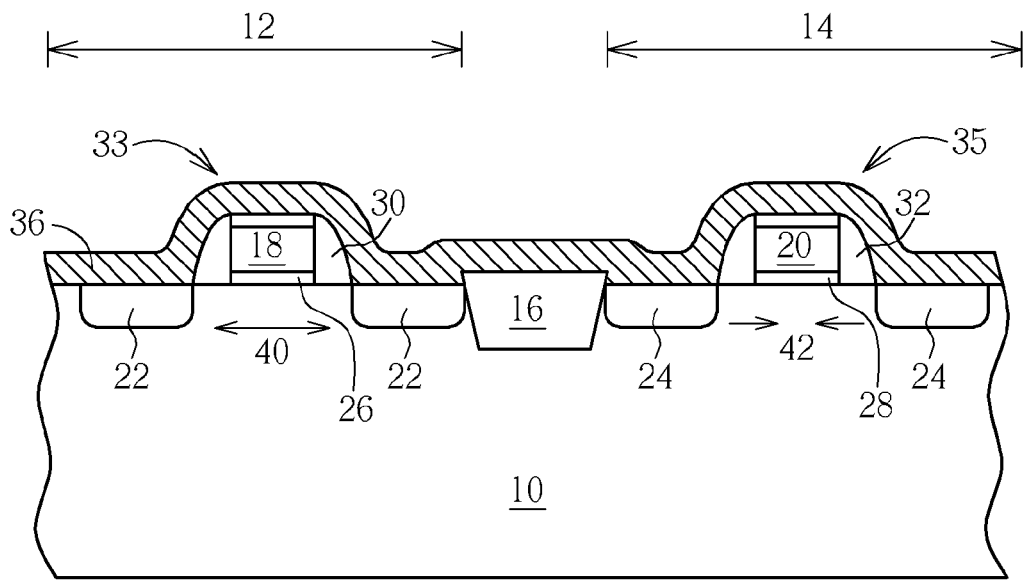
Figure 12:
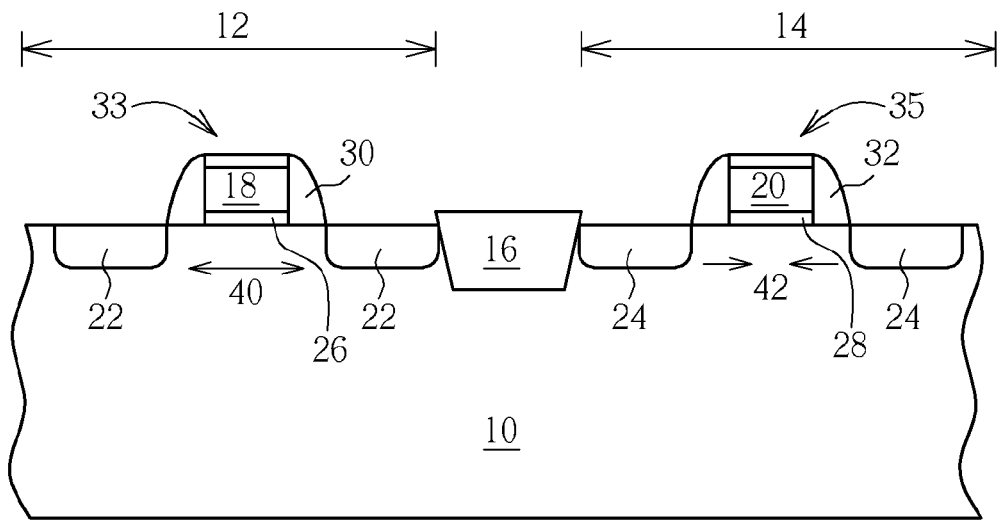

Next, as shown in FIG. 11, a second stressor 36 is formed to cover the first gate 18, source/drain region 22, STI 16, the second gate 20 and the source/drain region 24. A second annealing process is then performed. According to the preferred embodiment, the annealing process is a low temperature annealing process which is performed between 580° C. and 850° C. The amorphous silicon will be re-crystallized according to the direction that the first stressor 36 provided to form a second strained silicon channel 42. Then, as shown in FIG. 12, the stressor 36 is removed. At this point, the SMT applied in the source/drain regions is completed.

It is noteworthy that when the first-type conductivity is N type and the second-type conductivity is P type, the first stressor 34 is a tensile film and the second stressor 36 is a compressive film; the strained silicon channel 40 is a tensile strain channel and the strained silicon channel 42 is a compressive strain channel.

According to the fifth preferred embodiment of the present invention, Xe ions or Ar ions used in the ion implantation process mentioned in the fourth preferred embodiment can be replaced by C ions and Ge ions to amorphize the transistors having the corresponding conductivity. For example, when the first-type conductivity is N type and the second-type conductivity is P type, C ions can be used to perform the amorphizing process illustrated in FIG. 7 and Ge ions can be used to perform the amorphizing process illustrated in FIG. 10. Compared to the fourth preferred embodiment, in the fifth embodiment, the amorphous structure in the source/drain regions 22 is formed by implanting C ions and the silicon atoms are re-crystallized to form the strained silicon channel 40. Later, eSiC is formed in the source/drain region 22 by taking C ions as SPE dopants during the first annealing process. In the same way, the amorphous structure in the source/drain region 24 is formed by implanting Ge ions, and the silicon atoms are re-crystallized to form the strained silicon channel 42 during the second annealing process. Ge ions can also be the SPE dopants to form the eSiGe in the source/drain region 24 during the second annealing process. The eSiGe and the eSiC can provide tensile/compressive stress in the substrate. Therefore, there will be an additive effect to the carrier mobility of the transistors due to the SPE and the SMT. The strained force in the strained silicon channels 40, 42 will be greatly enhanced. In the same way, the dopants acting as conductors in the source/drain 22, 24 can be implanted before the C ions and Ge ions are implanted, after the C ions and Ge ions are implanted or after the SPE is formed.

According to the sixth embodiment of the present invention, in the amorphizing process illustrated in FIG. 7, Xe ions or Ar ions are implanted firstly into the source/drain region 22. When the first-type conductivity is N type and the second-type conductivity is P type, C ions are implanted into the source/drain region 22. In the amorphizing process illustrated in FIG. 10, Xe ions or Ar ions are implanted first into the source/drain region 24. Ge ions are then implanted into the source/drain region 24. Other fabricating steps are the same as that of the fourth embodiment. The SMT and SPE are achieved by performing two annealing processes. In the same way, the dopants acting as conductors in the source/drain regions 22, 24 can be implanted before the amorphizing process, after the amorphizing process but before C ions and Ge ions are implanted or after the SPE is formed.

In addition, the SMT can be performed after the single spacer is formed, after the offset spacer is formed, after the main spacer is formed, or after the second spacer of the triple-spacer is formed in every embodiment described above.

Moreover, each embodiment described above can be combined with other mechanical techniques to form strain. For example, growing SiGe or SiC in a recess of the substrate beside the gate (SiGe/SiC refill) or adding stress liner can also increase the performance of the CMOS transistor.

Those skilled in the art will readily observe that numerous modifications and alterations of the device and method may be made while retaining the teachings of the invention.

What is claimed is:

1. A method of forming a CMOS transistor, wherein the CMOS transistor is formed on a substrate, and the substrate comprising a first transistor region comprising a first gate and a first source/drain region, a second transistor region comprising a second gate and a second source/drain region, and an insulator positioned between the first transistor region and the second transistor region, wherein the first transistor region is used for forming a first-type conductivity transistor and the second transistor region is used for forming a second-type conductivity transistor, the method comprising:
    performing a first amorphizing process in the first source/drain region;
    forming a first stressor covering the first gate and the first source/drain region;
    performing a first annealing process to form a first strained silicon channel in the substrate under the first gate;
    removing the first stressor;
    performing a second amorphizing process in the second source/drain region;
    forming a second stressor covering the second gate and the second source/drain region;
    performing a second annealing process to form a second strained silicon channel in the substrate under the second gate; and
    removing the second stressor to form the CMOS transistor.

2. The method of claim 1, wherein the first-type conductivity is N type, the second-type conductivity is P type.

3. The method of claim 2, wherein the first amorphizing process is performed by implanting carbon ions into the first source/drain region.

4. The method of claim 3, wherein SiC is formed in the first source/drain region after the first annealing process is performed.

5. The method of claim 2, wherein the second amorphizing process is performed by implanting germanium ions into the second source/drain region.

6. The method of claim 5, wherein SiGe is formed in the second source/drain region after the second annealing process is performed.

7. The method of claim 2, wherein the first silicon strained channel comprises a tensile strained channel.

8. The method of claim 2, wherein the second silicon strained channel comprises a compressive strained channel.

9. The method of claim 1, wherein the first amorphizing process is performed by implanting xenon ions or argon ions into the first source/drain region and the second amorphizing process is performed by implanting xenon ions or argon ions into the second source /drain region.

10. The method of claim 1, wherein the first annealing process is a low temperature annealing process.

11. The method of claim 1, wherein the second annealing process is a low temperature annealing process.

12. A method of forming a CMOS transistor, wherein the CMOS transistor is formed on a substrate, and the substrate comprising a first transistor region comprising a first gate and a first source/drain region, a second transistor region comprising a second gate and a second source/drain region, and an insulator positioned between the first transistor region and the second transistor region, wherein the first transistor region is used for forming a N type conductivity transistor and the second transistor region is used for forming a P type conductivity transistor, the method comprising:
    performing an amorphizing process in the first source/drain region and in the second source/drain region, wherein the amorphizing process comprises implanting carbon ions into the first source/drain region;
    forming a first stressor covering the first gate and the first source/drain region;
    forming a second stressor covering the second gate and the second source/drain region;
    performing an annealing process to form a first strained silicon channel in the substrate under the first gate and form a second strained silicon channel in the substrate under the second gate; and
    removing the first stressor and the second stressor completely to form the CMOS transistor.

13. The method of claim 12, wherein SiC is formed in the first source/drain region after the annealing process is performed.

14. The method of claim 12, wherein the amorphizing process is performed by implanting germanium ions into the second source/drain region.

15. The method of claim 14, wherein SiGe is formed in the second source/drain region after the annealing process is performed.

16. The method of claim 12, wherein the first silicon strained channel comprises a tensile strained channel and the second silicon strained channel comprises a compressive strained channel.

17. The method of claim 12, the amorphizing process is performed by implanting xenon ions or argon ions into the first source/drain region and the second source/drain region respectively.

18. The method of claim 12, wherein the annealing process is a low temperature annealing process.

* * * * *